(12) United States Patent
Otto et al.

(10) Patent No.: US 11,069,842 B2
(45) Date of Patent: Jul. 20, 2021

(54) METHOD FOR PRODUCING AN OPTOELECTRONIC SEMICONDUCTOR COMPONENT AND OPTOELECTRONIC SEMICONDUCTOR COMPONENT

(71) Applicant: OSRAM Opto Semiconductors GmbH, Regensburg (DE)

(72) Inventors: Isabel Otto, Regenstauf (DE); Christian Leirer, Friedberg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/498,331

(22) PCT Filed: Apr. 3, 2018

(86) PCT No.: PCT/EP2018/058461
§ 371 (c)(1),
(2) Date: Sep. 26, 2019

(87) PCT Pub. No.: WO2018/185086
PCT Pub. Date: Oct. 11, 2018

(65) Prior Publication Data
US 2020/0220056 A1 Jul. 9, 2020

(30) Foreign Application Priority Data
Apr. 4, 2017 (DE) .................. 102017107201.2

(51) Int. Cl.
*H01L 33/58* (2010.01)
*H01L 33/00* (2010.01)
*H01L 33/62* (2010.01)

(52) U.S. Cl.
CPC .......... *H01L 33/58* (2013.01); *H01L 33/0095* (2013.01); *H01L 33/62* (2013.01);
(Continued)

(58) Field of Classification Search
CPC ..... H01L 33/58; H01L 33/0095; H01L 33/62; H01L 2933/0058; H01L 2933/0066
See application file for complete search history.

(56) References Cited

U.S. PATENT DOCUMENTS 9,748,309 B2    8/2017   von Malm
9,780,265 B2    10/2017  Herrmann et al.
(Continued)

FOREIGN PATENT DOCUMENTS

DE    102012217533 A1    3/2014
DE    102012112302 A1    6/2014
(Continued)

*Primary Examiner* — Shaun M Campbell
(74) *Attorney, Agent, or Firm* — Slater Matsil, LLP

(57) ABSTRACT

A method for producing an optoelectronic semiconductor component and an optoelectronic semiconductor component are disclosed. In an embodiment a method include providing a semiconductor layer sequence having an active region and a plurality of emission regions, forming a plurality of first contact points, filling spacings between the first contact points with a molding compound, removing a growth substrate of the semiconductor layer sequence and arranging the semiconductor layer sequence on a connection carrier comprising a control circuit and a plurality of connection surfaces, wherein each of the first contact points is electrically conductively connected to a connection surface, wherein the emission regions are independently controllable by the control circuit, and wherein the molding compound serves as a temporary auxiliary carrier that mechanically stabilizes the semiconductor layer sequence during the removal of the growth substrate.

14 Claims, 4 Drawing Sheets

(52) U.S. Cl.
CPC ............... *H01L 2933/0058* (2013.01); *H01L 2933/0066* (2013.01)

(56) References Cited

U.S. PATENT DOCUMENTS

| | | | |
|---|---|---|---|
| 9,899,418 B2 | 2/2018 | Pfeuffer et al. | |
| 2013/0234193 A1* | 9/2013 | Odnoblyudov | H01L 33/52 257/99 |
| 2014/0098556 A1* | 4/2014 | von Malm | F21S 41/143 362/543 |
| 2015/0014716 A1 | 1/2015 | von Malm | |
| 2015/0255439 A1 | 9/2015 | Kim | |
| 2015/0255685 A1 | 9/2015 | Herrmann et al. | |
| 2015/0279902 A1* | 10/2015 | Von Malm | H01L 27/156 257/88 |
| 2017/0092820 A1 | 3/2017 | Kim et al. | |
| 2017/0133557 A1* | 5/2017 | Zhong | H01L 33/486 |
| 2017/0294417 A1* | 10/2017 | Edmond | H01L 33/502 |
| 2018/0350788 A1* | 12/2018 | Rafael | H01L 25/167 |

FOREIGN PATENT DOCUMENTS

| | | |
|---|---|---|
| DE | 102014101492 A | 8/2015 |
| WO | 2013092304 A1 | 6/2013 |

* cited by examiner

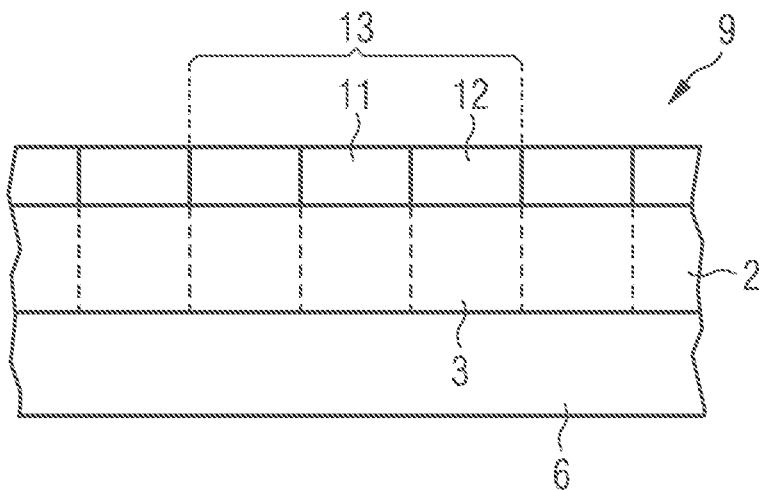
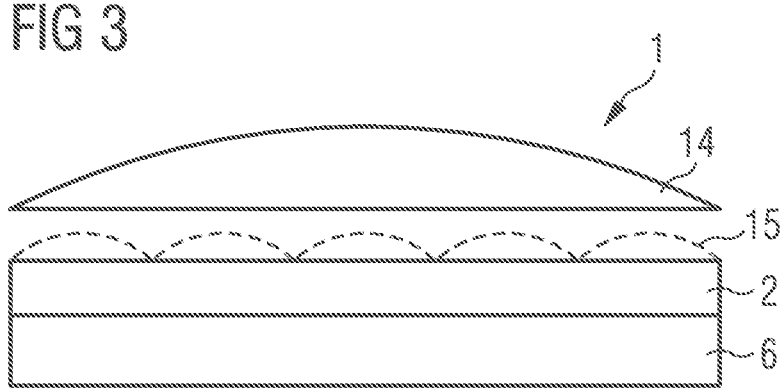
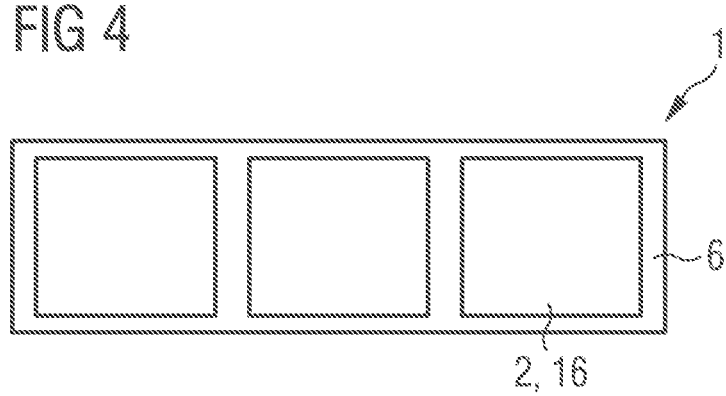

METHOD FOR PRODUCING AN OPTOELECTRONIC SEMICONDUCTOR COMPONENT AND OPTOELECTRONIC SEMICONDUCTOR COMPONENT

This patent application is a national phase filing under section 371 of PCT/EP2018/058461, filed Apr. 3, 2018, which claims the priority of German patent application 102017107201.2, filed Apr. 4, 2017, each of which is incorporated herein by reference in its entirety.

TECHNICAL FIELD

The present application relates to a method for manufacturing an optoelectronic semiconductor device and an optoelectronic semiconductor device.

BACKGROUND

In the case of radiation-emitting semiconductor devices with a plurality of radiation-emitting areas, control circuits based on silicon can be used to individually control the radiation-emitting areas. However, placing these areas on the corresponding control circuit is complex and thus cost-intensive.

SUMMARY OF THE INVENTION

Embodiments provide an optoelectronic semiconductor device with multiple emission regions which can be easily manufactured. Further embodiments provide an optoelectronic semiconductor device with a plurality of emission regions which can be produced easily and compactly.

Various embodiments provide a method for manufacturing an optoelectronic semiconductor device.

According to at least one embodiment of the method, a semiconductor layer sequence is provided having an active region provided for generating radiation. For example, the active region emits radiation in the ultraviolet, visible or infrared spectral range. For example, the active region is located between a first semiconductor layer of a first conductivity type and a second semiconductor layer of a second conductivity type different from the first conductivity type. The active area is therefore in a pn junction.

For example, the active region has a plurality of emission regions. The emission regions are arranged next to each other in a lateral direction and can be electrically contacted independently of each other. The active area is therefore functionally divided into a plurality of emission regions. For example, adjacent active regions are completely separated from each other, for example, by trench-shaped recesses in the semiconductor layer sequence that separate the active region. However, the active region may also extend continuously over two or more emission regions, in particular over all emission regions, as long as the emission regions can be operated with different current strength during operation.

In accordance with at least one embodiment of the method, a plurality of first contact points, each of which is electrically conductively connected to an emission region, is formed on the semiconductor layer sequence. In particular, the first contact points are electrically connected to the first semiconductor layer.

According to at least one embodiment of the method, spacings between the contact points are filled with a molding compound, in particular completely. The molding compound is molded onto the contact points and at least in places directly adjoins the contact points. The molding compound is in particular electrically insulating. For example, filling is carried out by means of a casting process. For example, the molding compound contains a polymer material such as a silicone, an epoxy or another material that can be processed by a casting process.

A casting process is generally understood to be a process with which a molding compound can be shaped according to a specified shape and, if necessary, cured. In particular, the term 'molding' includes molding, film assisted molding, injection molding, transfer molding and compression molding.

According to at least one embodiment of the method, the semiconductor layer sequence is arranged on a connection carrier having a control circuit and a plurality of connection surfaces, the first contact points each being electrically conductively connected to a connection surface. The term "connection surface" generally refers to an area of the connection carrier which is intended for electrical contacting of an element to be controlled by the control circuit. For example, the emission regions can be controlled independently of each other by means of the control circuit. The connection carrier, for example, has an active matrix circuit for controlling the emission regions. For example, each emission region is assigned at least one switch, for example, in the form of a transistor.

In at least one embodiment of the method of manufacturing an optoelectronic semiconductor device, a semiconductor layer sequence is provided having an active region provided for generating radiation and having a plurality of emission regions. A plurality of first contact points, each of which is electrically conductively connected to an emission region, is formed on the semiconductor layer sequence. Spacings between the first contact points are filled with a molding compound. The semiconductor layer sequence is arranged on a connection carrier with a control circuit and a plurality of connection surfaces, whereby the first contact points are each electrically conductively connected to a connection surface and the emission regions can be controlled independently of each other by means of the control circuit.

By means of the molding compound, the spacings between the first contact points can be filled in a simple and reliable way. Compared to dielectric layers, which are applied by vapor deposition or sputtering, large layer thicknesses can be achieved quickly and cost-effectively.

According to at least one exemplary embodiment of the method, the connection carrier is provided in a connection carrier assembly and the connection carrier assembly and the semiconductor layer sequence are singulated into a plurality of semiconductor devices after the semiconductor layer sequence has been arranged on the connection carrier. In other words, the compound of the connection carrier assembly and the semiconductor layer sequence is singulated together. The optoelectronic semiconductor devices produced during singulation each have a plurality of emission regions and a control circuit via which the emission regions can be controlled.

The manufacturing steps prior to singulation can be carried out in a compound, i.e., at wafer level. In particular, the lateral expansion of the semiconductor layer sequence can be so large that a plurality of optoelectronic semiconductor devices can be manufactured, each of which has a part of this semiconductor layer sequence with a plurality of emission regions. Single placement of a semiconductor body for each optoelectronic semiconductor device to be manufactured can be dispensed with.

According to at least one embodiment of the method, the connection carrier assembly and the molding compound are separated during singulation. In singulation, two elements are separated which have only been joined together during the formation of the assembly with semiconductor layer sequence and connection carrier assembly. At points where the connection carrier assembly and the molding compound are separated, the connection carrier thus formed and the shaped body formed from the molding compound is flush in the lateral direction. The connection carrier and the shaped body may show traces specific to the singulation process, such as traces of material removal.

In accordance with at least one exemplary embodiment of the method, a growth substrate is removed from the semiconductor layer sequence. The growth substrate used for epitaxial deposition, for example, by MOCVD or MBE, is no longer present in the finished optoelectronic semiconductor device. The optoelectronic semiconductor device is therefore free of a growth substrate. The connection carrier can mechanically stabilize the semiconductor layer sequence, so that the growth substrate is no longer required for this.

According to at least one embodiment of the method the growth substrate is removed before the semiconductor layer sequence is connected to the connection carrier. The growth substrate is therefore already removed when the compound with semiconductor layer sequence and connection carrier assembly is produced. This avoids the danger of different sized coefficients of thermal expansion for the connection carrier and the growth substrate leading to damage, such as cracks, in the semiconductor layer sequence. For example, the thermal expansion coefficients of sapphire and silicon differ comparatively greatly from each other.

In accordance with at least one embodiment of the method, the first contact points are completely covered when the molding compound is applied and subsequently uncovered. For example, the material of the molding compound is completely removed from the side facing away from the semiconductor layer sequence until the first contact points are reached. For example, exposure takes place by means of a mechanical, chemical or chemical mechanical process, such as chemical mechanical polishing.

According to at least one embodiment of the method, the first contact points are completely covered, the growth substrate is removed and the first contact points are exposed after removal of the growth substrate.

At the time the growth substrate is removed, the molding compound may have a greater thickness than in the finished optoelectronic semiconductor device. In other words, the molding compound serves as a temporary auxiliary carrier that mechanically stabilizes the semiconductor layer sequence during this step.

The first contact points and the connection points are connected to each other by means of a direct bond connection in accordance with at least one embodiment of the method. With a direct bond connection, the connection partners to be connected, in particular prefabricated connection partners, are connected to each other without a joining layer, in particular without an adhesive layer or solder layer, for example, under the influence of pressure and/or heat. A direct bond connection is made, for example, via van der Waals interactions and/or hydrogen bonds. Deviating from this, however, a connection can also be made in particular by means of an electrically conductive joining layer.

According to at least one embodiment of the method, the active region is arranged between a first semiconductor layer and a second semiconductor layer. The first contact points are electrically connected to the first semiconductor layer. The second semiconductor layer is electrically conductively connected to at least one second contact point and material for the first contact points and the second contact points is deposited in a common manufacturing step. This means that material for contact points that lie at a different electrical potential during subsequent operation can be deposited in a single step. This simplifies production.

According to at least one embodiment of the method the first contact points are formed by galvanic deposition. Galvanic deposition, especially compared to processes such as evaporation or sputtering, allows large layer thicknesses to be achieved quickly and cost-effectively. In addition, material can be saved since the deposition only takes place at points where the material is desired. Nickel, copper and gold, for example, are particularly suitable for galvanic deposition. However, another metal may also be used. Multi-layer deposition is also possible.

Furthermore, an optoelectronic semiconductor device is specified.

According to at least one embodiment of the optoelectronic semiconductor device, the optoelectronic semiconductor device comprises a semiconductor layer sequence having an active region provided for generating radiation, wherein the active region comprises a plurality of emission regions and the emission regions are each electrically conductively connected to a first contact point. The optoelectronic semiconductor device has a connection carrier with a control circuit and a plurality of connection surfaces, whereby the first contact points are each electrically conductively connected to a connection surface and the emission regions can be controlled independently of one another by means of the control circuit. In particular, a shaped body is arranged in spacings between the first contact points and is molded on the first contact points.

The shaped body thus fills spacings in the lateral direction, i.e., parallel to a main extension plane of the active region, between adjacent first contact points and in the vertical direction, i.e., perpendicular to the main extension plane of the active region, between the semiconductor layer sequence and the connection carrier, in particular completely.

According to at least one embodiment of the optoelectronic semiconductor device, the shaped body and the first contact points form a planar surface on a side facing the connection carrier. The first contact points do not protrude beyond the molding compound and vice versa. In particular, the surface is so flat that there can be a direct bond connection between the connection surfaces and the first contact points. For example, the area facing the connection carrier has an average square roughness (rms roughness) of at most 10 nm, in particular of at most 5 nm. However, a greater roughness may also be sufficient, for example, in the case of a connection by means of a joining layer.

According to at least one embodiment of the optoelectronic semiconductor device, the shaped body and the connection carrier are flush at least in places in the lateral direction. Thus the shaped body and the connection carriers with the control circuit together form a side surface in places which limits the optoelectronic semiconductor device in the lateral direction.

The optoelectronic semiconductor device is characterized in particular by the lateral expansion of the semiconductor device being only slightly greater than the lateral expansion of the active area.

According to at least one embodiment of the optoelectronic semiconductor device, an area within an outer border of the active region covers at least 80% of the connection carrier. In case of doubt, the outer border can be determined by an imaginary elastic band that completely surrounds the active area in lateral direction.

According to at least one embodiment, the optoelectronic semiconductor device comprises one or more phosphors and/or one or more projection lens. RGB pixels can be achieved using phosphors that can be individually assigned to the emission regions. A projection device can be set up by means of at least one projection lens for all emission regions of the semiconductor component or for individual emission regions or for groups of emission regions.

It is possible that the semiconductor device comprises a plurality of semiconductor bodies. The semiconductor bodies can be designed as modules from which the semiconductor device is constructed.

The method described above is particularly suitable for the manufacture of the optoelectronic semiconductor device. Features mentioned in connection with the methods can therefore also be used for the optoelectronic semiconductor device and vice versa.

BRIEF DESCRIPTION OF THE DRAWINGS

Further embodiments and developments can be derived from the following description of the exemplary embodiments in connection with the figures In the figures:

FIGS. 2 and 3 show schematic sections of exemplary embodiments of optoelectronic semiconductor devices; and FIG. 4 shows a schematic top view of an exemplary embodiment of an optoelectronic semiconductor device.

Identical, similar or similarly acting elements are provided in the figures with the same reference signs.

The figures are schematic representations and therefore not necessarily true to scale. Rather, comparatively small elements and, in particular, layer thicknesses can be displayed exaggeratedly large for clarification.

DETAILED DESCRIPTION OF ILLUSTRATIVE EMBODIMENTS

FIGS. 1A to 1G show an example of a method using intermediate steps while, for simplified representation, FIGS. 1A to 1F show only a part of an optoelectronic semiconductor device to be manufactured. With this method, a plurality of such optoelectronic semiconductor devices can be manufactured simultaneously.

Figure 1A:
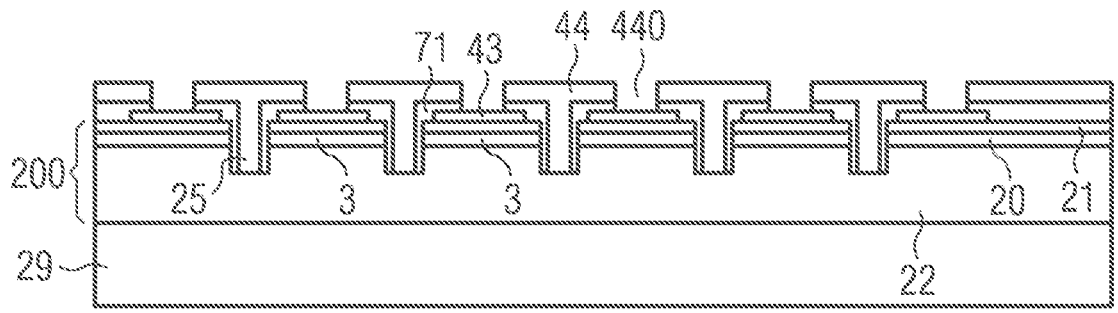
FIGS. 1A, 1B, 1C, 1D, 1E, 1F and 1G show exemplary embodiments of a method using schematically represented intermediate steps in sectional views (FIGS. 1A to 1F) and in plan view (FIG. 1G), FIGS. 1F and 1G being an example of an optoelectronic semiconductor device.

A semiconductor layer sequence 200 is provided as shown in FIG. 1A, for example, on a growth substrate 29. The semiconductor layer sequence 200 has an active region 20 intended for generating radiation, which is arranged between a first semiconductor layer 21 of a first conductivity type, for example, p-conductive, and a second semiconductor layer 22 of a second conductivity type, for example, n-conductive.

The first semiconductor layer 21 is arranged on the side of the active area 20 facing away from the growth substrate 29. The semiconductor layer sequence 200 has a plurality of recesses 25 extending through the first semiconductor layer 21 and the active region 20 into the second semiconductor layer 22. In the recesses 25, the second semiconductor layer 22 is exposed for electrical contacting.

The first semiconductor layer 21 is electrically connected to a first contact layer 43. The first contact layer, for example, is formed as a mirror layer for the radiation to be generated in the active area 20. For example, the first contact layer contains silver, aluminum, rhodium, palladium, nickel or chromium or a metallic alloy with at least one of the mentioned metals.

The second semiconductor layer 22 is electrically connected to a second contact layer 44. The second contact layer 44 adjoins the second semiconductor layer 22 in the recesses 25. The second contact layer 44 can, for example, be formed by galvanic deposition. A layer thickness, for example, is between 1 µm inclusive and 150 µm inclusive. The second contact layer 44 can give the semiconductor layer sequence 200 increased mechanical stability and fulfil the function of a lateral current spreading layer in the optoelectronic semiconductor device to be manufactured.

The first contact layer 43 and the second contact layer 44 overlap in places in the vertical direction, i.e., perpendicular to a main extension plane of the active area 20. A first isolation layer 71 is arranged on the semiconductor layer sequence 200. The first isolation layer 71 covers at least the active area 20 on the side surfaces of the recesses 25 and the first semiconductor layer 21. An electrical short circuit between the second contact layer 44 and the first semiconductor layer 21 can thus be reliably avoided. The second contact layer 44 has a plurality of openings 440. The first contact layer 43 is exposed in the openings.

Despite the openings, the second contact layer 44 runs continuously over a plurality of emission regions 3, in particular over all emission regions of an optoelectronic semiconductor device to be manufactured.

The active area 20 has a plurality of emission regions 3. The emission regions are arranged side by side in lateral direction, i.e., along a main extension plane of the active area, e.g., matrix-shaped.

The recesses 25 can completely surround an emission region 3 in lateral direction, so that adjacent emission regions 3 are completely separated from each other. Deviating from this, however, the active area 20 may also extend continuously over several or all emission regions 3. In this case, the lateral expansion of the first contact layer 43 essentially determines the lateral expansion of the associated emission region 3.

Figure 1B:
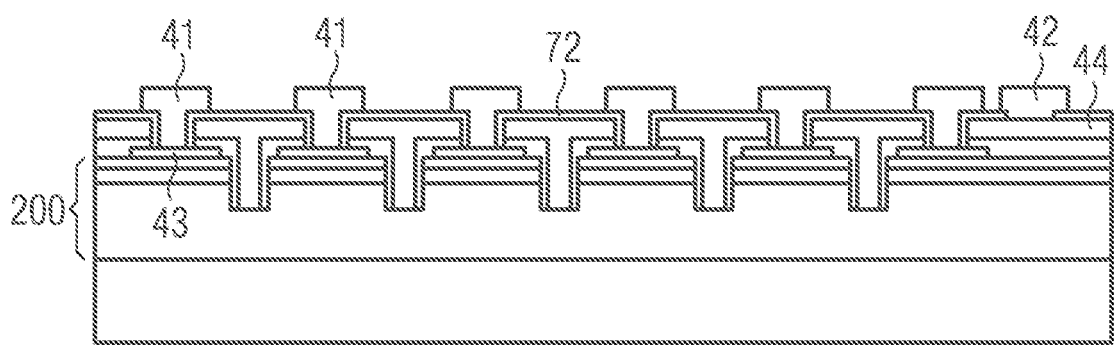

Subsequently, as shown in FIG. 1B, a second isolation layer 72 is applied to the semiconductor layer sequence 200. The second isolation layer 72 in particular completely covers the second contact layer 44. The second isolation layer 72 is formed in such a way that the first contact layer 43 is exposed in places in the openings 440.

Subsequently, a plurality of the first contact points 41 are deposited, in particular by means of a galvanic process. Each emission region 3 is assigned a first contact point 41, in particular unambiguously. The first contact point 41 in the openings 440 is adjacent to the first contact layer 43 of the assigned emission region 3.

In the same deposition step, a plurality of second contact points 42 is formed. Deviating from this, it is also conceivable that the first contact points 41 and the second contact points 42 are formed in separate manufacturing steps.

The second contact points 42 are electrically connected to the second contact layer 44. The second contact point 42 is used for electrical contacting of the second semiconductor layer 22, in particular as a common counter-contact for several or all emission regions 3. Therefore for each semiconductor component to be manufactured, exactly one second contact point is basically sufficient. However, the optoelectronic semiconductor device may also have two or more second contact points.

Figure 1C:
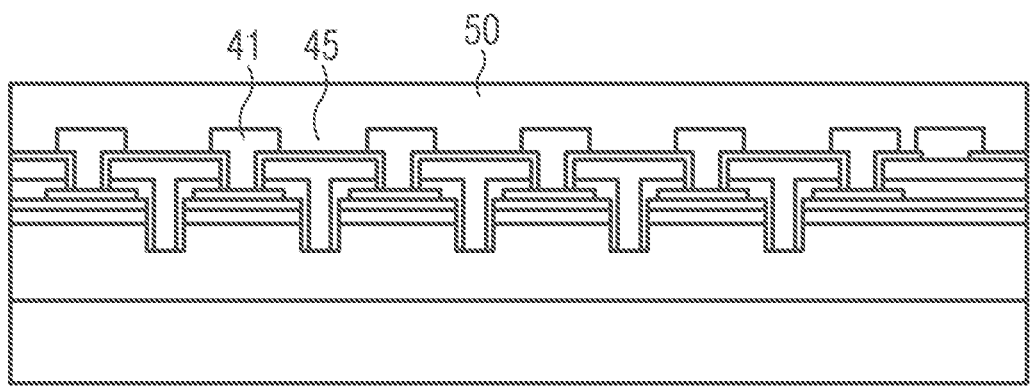

Spacings 45 between adjacent first contact points 41 are subsequently filled with a molding compound 50, as shown in FIG. 1C. Filling is carried out, for example, by means of a casting process and, if necessary, with subsequent curing. In particular, molding compound 50 can be designed so that it completely covers the semiconductor layer sequence 200 and also covers the first contact points 41 and the second contact points 42.

In particular, the molding compound 50 can be so thick that it mechanically stabilizes the semiconductor layer sequence 200. At this method stage, the growth substrate can be removed, for example, by a mechanical process, a chemical process or by coherent radiation, such as a laser lift-off (LLO) process.

The molding compound 50 thus temporarily fulfils the function of an auxiliary carrier for the removal of the growth substrate 29, whereby a part of this auxiliary carrier, i.e., a part of the molding compound 50, remains in the finished optoelectronic semiconductor device 1 as shaped body 5.

Figure 1D:
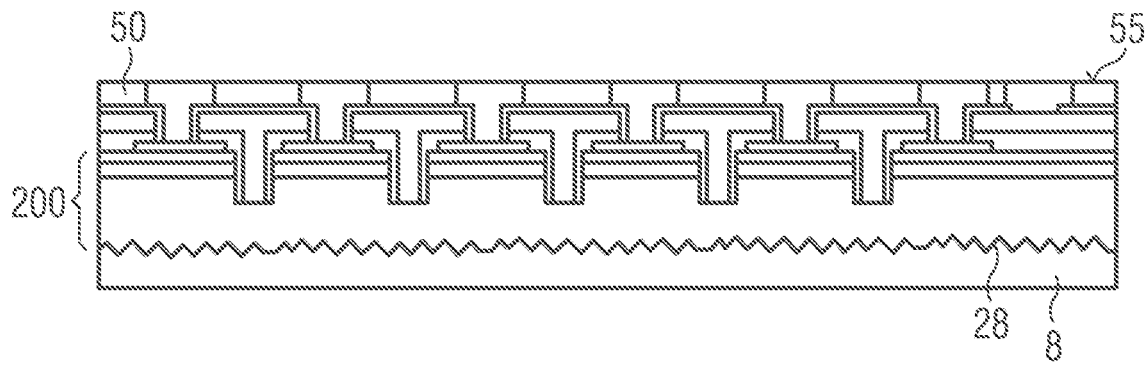

After removal of the growth substrate 29, the second semiconductor layer 22 exposed in this way can be provided with a roughening 28 (FIG. 1D). The roughening process can improve the efficiency of the radiation decoupling during operation of the optoelectronic semiconductor device.

An optional radiation conversion element 8 can be applied to the semiconductor layer sequence 200. For example, the radiation conversion element is designed to convert primary radiation generated in the active region, such as in the blue spectral range, into secondary radiation, such as in the yellow spectral range, so that the optoelectronic semiconductor device emits mixed light, such as light that appears white to the human eye.

The first contact points 41 and the second contact points 42 are exposed, especially after removing the growth substrate 29. For this purpose, material of the molding compound 50 can be removed over its entire surface from the side facing away from the semiconductor layer sequence 200 until the first contact points 41 and the second contact points 42 are exposed. This can be done mechanically, e.g., by grinding or polishing, chemically, e.g., by etching, or chemomechanically, e.g., by chemomechanical polishing.

This creates a planar surface 55 on the side of the molding compound 50 facing away from the semiconductor layer sequence 200. This planar surface is formed in places by the molding compound 50, the first contact points 41 and the second contact points 42. For example, an average square roughness (rms roughness) of the planar surface is at most 10 nm or at most 5 nm.

Figure 1E:
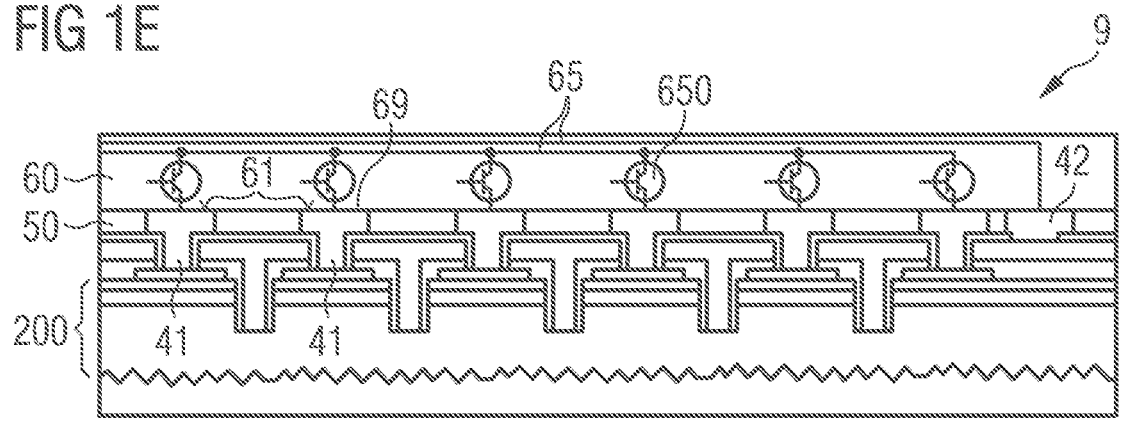

Subsequently, a compound 9 is formed which has the semiconductor layer sequence 200 and a connection carrier assembly 60 (FIG. 1E). For this purpose, the semiconductor layer sequence 200 is attached to the connection carrier assembly 60 by means of a connection 69, for example, by means of a direct bond connection. Instead of a direct bond connection, a connection can also be made using a joining layer, such as an electrically conductive adhesive layer or a solder layer. In this case, the planar surface 55 may also have a larger surface roughness, for example, 100 nm or more.

The semiconductor layer sequence 200 can already be subdivided into a plurality of segments at the time of manufacturing of the compound 9, for example, by a singulation process, the individual segments each having a plurality of emission regions, in particular all emission regions of the optoelectronic semiconductor device to be manufactured. The segments, for example, each represent a semiconductor body with a semiconductor body formed from the semiconductor layer sequence 200, which is individually applied to the connection carrier assembly 60, for example, by soldering. The center distances of neighboring segments in compound 9 can thus also be larger than the center distances of these segments prior to the formation of the compound, for example, on the original growth substrate 29. The center distances of the segments on the connection carrier assembly are therefore not necessarily determined by the center distances of the segments on the original growth substrate. The center distance of adjacent emission regions within a segment on the connection carrier assembly, however, corresponds to the original center distance of the emission regions on the growth substrate.

For each optoelectronic semiconductor device to be manufactured, the connection carrier assembly 60 has a control circuit 65 with a plurality of connection surfaces 61. For example, control circuit 65 is an active matrix circuit, with each emission region 3 being assigned a switch 650, for example, in the form of a transistor. For example, the connection carrier assembly is a silicon-based wafer on which transistors and other electronic components are manufactured using CMOS technology.

The semiconductor layer sequence 200 and the connection carrier assembly 60 are connected to each other in such a way that every first contact point 41 and every second contact point 42 are each electrically conductively connected to a connection surface 61 of the connection carrier assembly 60.

Figure 1F:
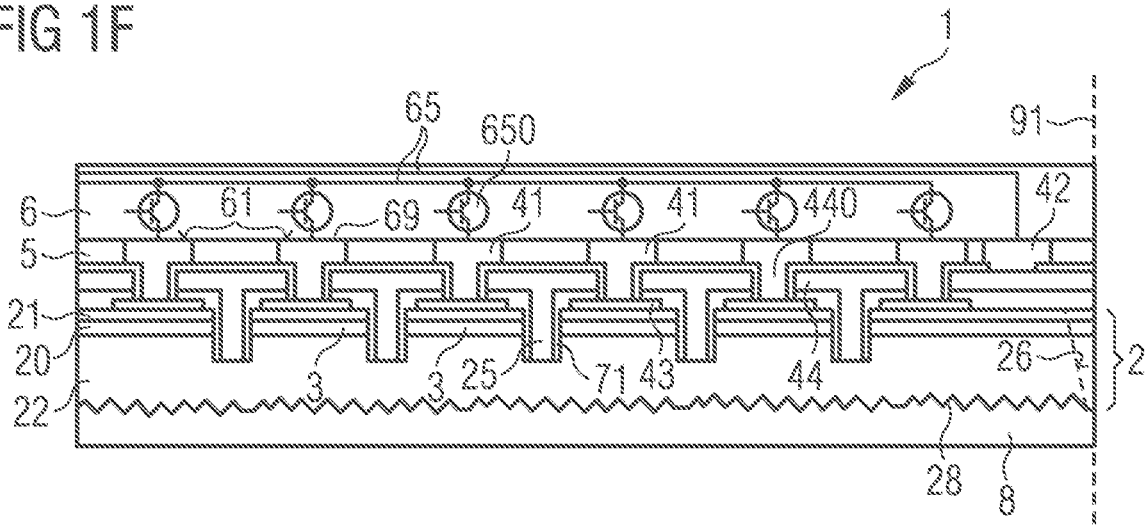

Compound 9 can subsequently be separated along singulation lines 91 (FIG. 1F). This can be done mechanically, chemically or by means of coherent radiation. The singulation produces a plurality of optoelectronic semiconductor devices 1, each optoelectronic semiconductor device 1 resulting from the compound 9 having a connection carrier 6 as part of the connection carrier assembly 60, a semiconductor body 2 as part of the semiconductor layer sequence 200 and a shaped body 5 as part of the molding compound 50.

When singulating, in particular the connection carrier assembly 60 and the molding compound 50 are separated. Thus, for each optoelectronic semiconductor device 1, the shaped body 5 is formed from the molding compound 50. The shaped body 5 and the connection carrier 6 are flush at least in places in the lateral direction, in particular along the singulation lines 91. The shaped body 5 and the connection carrier 6 may have traces of the singulation process in places, for example, traces of material removal such as saw marks, etching marks or traces of material removal by coherent radiation.

The semiconductor layer sequence 200 may already be removed in a preceding method step in the region of the singulation lines 91, so that the semiconductor layer sequence 200 does not necessarily have to be separated during singulation. The formation of the side surfaces can take place in particular from the side facing away from the growth substrate, for example, together with the formation of the recesses 25 (see, for example, FIG. 1A).

This is shown schematically in FIG. 1F using a side surface 26 of semiconductor body 2.

Figure 1G:
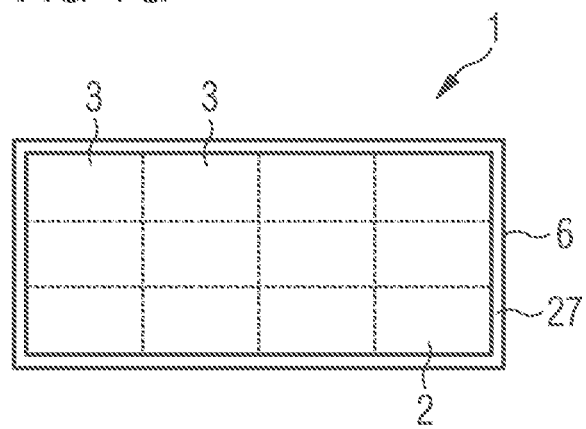

A finished optoelectronic semiconductor device 1 is shown schematically in top view in FIG. 1G, with twelve emission regions shown only for simplified illustration. The number of emission regions can be varied within wide limits and can be 100 or more or 1000 or more.

The described method can be used to produce optoelectronic semiconductor devices in which the area generating the radiation, i.e., the area of the active region, is almost as large in plan view as the total size of the optoelectronic semiconductor device including the connection carrier 6 with the control circuit 65. For example, an area running within an outer border 27 of the active region 20 covers at least 80% of the connection carrier 6. The optoelectronic semiconductor device can also be particularly compact in the vertical direction. Overall, material requirements and manufacturing costs can be reduced.

Manufacturing steps concerning the semiconductor layer sequence 200 can already be carried out before the compound 9 is formed. In particular, the growth substrate 29 may already be removed before the compound 9 is formed. After the manufacturing of compound 9, no further steps are required apart from separation. For the processing of the semiconductor layer sequence 200, processes to be carried out therefore do not have to be adapted to the manufacturing technology of the connection carrier, such as silicon technology. This applies, for example, to the adaptation of LED technology processes to the typically larger wafers of silicon technology.

The connection carrier assembly 60 can be assembled with semiconductor bodies 2 at wafer level. A complex individual placement of semiconductor bodies is therefore not necessary.

The joint singulation of the semiconductor layer sequence 200 and the connection carrier assembly 60 results in optoelectronic semiconductor devices 1, each of which has a plurality of emission regions 3, which can be controlled independently of one another via the control circuit 65 integrated in the connection carrier 6.

In the exemplary embodiment of the semiconductor component 1 of FIG. 2, phosphors 11, 12 for red and green light are assigned to a part of the emission regions 3. Especially together with blue light directly from semiconductor body 2, RGB pixels 13 can be built up. Such phosphors 11, 12 can also be present in all other exemplary embodiments.

The exemplary embodiment in FIG. 3 illustrates that a lens 14 is arranged downstream of the semiconductor body 2, for example, to project the generated radiation onto a distant surface. Alternatively or in addition to lens 14, which may span the entire semiconductor body 2, there may also be lenses 15 associated with individual emission regions or pixels or groups of emission regions.

The semiconductor device 1, as illustrated in FIG. 4, has a plurality of modules 16. Each of the modules 16 is, for example, formed by one of the semiconductor bodies 2 or by one of the semiconductor bodies 2 together with the associated connection carrier 6. If modules 16 are only formed from semiconductor body 2, a common connection carrier 6 is preferred for all modules 16.

There can be more than the example amount of three modules 16. Per module 16 or for a plurality of modules 16 one lens, not shown, can be provided. The modules 16 are preferably arranged close to each other.

The optoelectronic semiconductor device 1 is suitable, for example, as a light source in an adaptive headlamp for a motor vehicle, for a pixelated flash light in a hand-held electronic device such as a mobile phone, or generally for all applications in which spatial variation of the power density of the emitted radiation is desired during operation of the optoelectronic semiconductor device.

In particular, the semiconductor device 1 may be a display, for example, in a smartphone, tablet, notebook, camera, touch screen, television, computer screen or display panel. In addition, the semiconductor component 1 can be used as a projection device, especially as a so-called pico projector. Pico projectors, for example, are built into portable devices such as smartphones. Semiconductor component 1 can also be used as a projection device, for example, as a beamer for video presentations.

The type of electrical contacting of the individual emission regions 3 can be varied within wide limits deviating from the described exemplary embodiment, as long as charge carriers are injected from opposite sides into the active areas 20 of the individual emission regions 3 and can recombine there under emission of radiation. For example, the first semiconductor layer 21 facing the connection carrier 6 can also be provided with a common electrical contact for the emission regions 3 and the second semiconductor layer 22 can be electrically connected to a switch 650 of the control circuit 65.

Different embodiments of the electrical contacting of individual emission regions are described in the document WO 2013/092304 A1, the entire disclosure content of which is included in this application by reference.

The invention is not limited by the description of the exemplary embodiments. Rather, the invention includes any new feature and any combination of features, which in particular includes any combination of features in the patent claims, even if that feature or combination itself is not explicitly mentioned in the patent claims or the exemplary embodiments.

The invention claimed is:

1. A method for manufacturing an optoelectronic semiconductor device, the method comprising:
   providing a semiconductor layer sequence having an active region for generating radiation and a plurality of emission regions;
   forming a plurality of first contact points, each of the first contact points being electrically conductively connected to an emission region on the semiconductor layer sequence;
   filling spacings between the first contact points with a molding compound;
   removing a growth substrate of the semiconductor layer sequence; and
   arranging the semiconductor layer sequence on a connection carrier comprising a control circuit and a plurality of connection surfaces,
   wherein each of the first contact points is electrically conductively connected to a connection surface,
   wherein the emission regions are independently controllable of one another by the control circuit,
   wherein the molding compound serves as a temporary auxiliary carrier that mechanically stabilizes the semiconductor layer sequence during the removal of the growth substrate, and
   wherein the growth substrate is removed prior to arranging the semiconductor layer sequence on the connection carrier.

2. The method according to claim 1, wherein the connection carrier comprises a connection carrier assembly, and wherein the connection carrier assembly and the semiconductor layer sequence are singulated into a plurality of semiconductor components.

3. The method according to claim 2, wherein the connection carrier assembly and the molding compound are separated during singulation.

4. The method according to claim 1, wherein filling the spacings between the first contact points comprises completely covering the first contact points and subsequently exposing the first contact points.

5. The method according to claim 1, wherein filling the spacings between the first contact points comprises completely covering the first contact points, then removing the growth substrate, and then exposing the first contact points after removing the growth substrate.

6. The method according to claim 1, wherein the first contact points and connection points are connected to each other by a direct bond connection.

7. The method according to claim 1,
wherein the active region is disposed between a first semiconductor layer and a second semiconductor layer,
wherein the first contact points are electrically conductively connected to the first semiconductor layer,
wherein the second semiconductor layer is electrically conductively connected to at least one second contact point, and
wherein a material for the first contact points and the second contact points is deposited in a common manufacturing step.

8. The method according to claim 1, wherein the first contact points are formed by a galvanic deposition.

9. A method for manufacturing an optoelectronic semiconductor device, the method comprising:
providing a semiconductor layer sequence having an active region for generating radiation and a plurality of emission regions;
forming a plurality of first contact points, each of the first contact points being electrically conductively connected to an emission region on the semiconductor layer sequence;
filling spacings between the first contact points with a molding compound;
removing a growth substrate of the semiconductor layer sequence; and
arranging the semiconductor layer sequence on a connection carrier comprising a control circuit and a plurality of connection surfaces,
wherein each of the first contact points is electrically conductively connected to a connection surface,
wherein the emission regions are independently controllable of one another by the control circuit,
wherein the molding compound serves as a temporary auxiliary carrier that mechanically stabilizes the semiconductor layer sequence during the removal of the growth substrate, and
wherein filling the spacings between the first contact points comprises completely covering the first contact points, then removing the growth substrate, and then exposing the first contact points after removing the growth substrate.

10. The method according to claim 9, wherein the connection carrier comprises a connection carrier assembly, and wherein the connection carrier assembly and the semiconductor layer sequence are singulated into a plurality of semiconductor components.

11. The method according to claim 10, wherein the connection carrier assembly and the molding compound are separated during singulation.

12. The method according to claim 9, wherein the first contact points and connection points are connected to each other by a direct bond connection.

13. The method according to claim 9,
wherein the active region is disposed between a first semiconductor layer and a second semiconductor layer,
wherein the first contact points are electrically conductively connected to the first semiconductor layer,
wherein the second semiconductor layer is electrically conductively connected to at least one second contact point, and
wherein a material for the first contact points and the second contact points is deposited in a common manufacturing step.

14. The method according to claim 9, wherein the first contact points are formed by a galvanic deposition.

\* \* \* \* \*